US009818976B2

(12) United States Patent
Poon et al.

(10) Patent No.: US 9,818,976 B2
(45) Date of Patent: Nov. 14, 2017

(54) ENCAPSULATION LAYERS WITH IMPROVED RELIABILITY

(71) Applicant: Apple Inc., Cupertino, CA (US)

(72) Inventors: Stephen S. Poon, San Jose, CA (US); Chih Jen Yang, Taipei (TW); Damien S. Boesch, San Jose, CA (US); Bhadrinarayana L. Visweswaran, Princeton, NJ (US)

(73) Assignee: Apple Inc., Cupertino, CA (US)

(*) Notice: Subject to any disclaimer, the term of this patent is extended or adjusted under 35 U.S.C. 154(b) by 135 days.

(21) Appl. No.: 14/705,364

(22) Filed: May 6, 2015

(65) Prior Publication Data

US 2015/0333293 A1 Nov. 19, 2015

Related U.S. Application Data

(60) Provisional application No. 61/992,727, filed on May 13, 2014.

(51) Int. Cl.
*H01L 51/52* (2006.01)
*H01L 27/32* (2006.01)
*H01L 51/56* (2006.01)

(52) U.S. Cl.
CPC .......... *H01L 51/5253* (2013.01); *H01L 27/32* (2013.01); *H01L 51/56* (2013.01)

(58) Field of Classification Search
CPC ..... H01L 51/5253; H01L 52/56; H01L 27/32; H01L 51/52; H01L 51/56

(Continued)

(56) References Cited

U.S. PATENT DOCUMENTS 7,598,519 B2 10/2009 Leo et al.
8,222,811 B2 7/2012 Vaufrey et al.
(Continued)

FOREIGN PATENT DOCUMENTS

EP 2876532 5/2015
WO 2014210613 12/2014

OTHER PUBLICATIONS

Yota, "Effects of Deposition Method of PECVD Silicon Nitride as MIM Capacitor Dielectric for GaAs HBT Technology," Symposium on Silicon Nitride, Silicon Dioxide, and Emerging Dielectrics of the 2011 Electrochemical Society (ECS) Meeting, May 1-6, 2011 [Retreived on May 13, 2014]. Retrieved from the Internet:<URL: http://www.skyworksinc.com/downloads/press_room/published_articles/ecs_052011.pdf>.

(Continued)

*Primary Examiner* — Alexander Oscar Williams
(74) *Attorney, Agent, or Firm* — Treyz Law Group, P.C.; Kendall W. Abbasi

(57) ABSTRACT

An electronic device may include a display having an array of organic light-emitting diodes formed on a substrate. An encapsulation layer may be formed over the array of organic light-emitting diodes to protect the organic light-emitting diodes from moisture and other contaminants. The encapsulation layer may include a transparent sheet of material interposed between upper and lower inorganic films. The reliability of the encapsulation layer is increased by dividing one or both of the inorganic films into multiple sub-layers. The sub-layers may have different densities and may be deposited in sequential steps. Additional moisture protection may be provided by forming a conformal thin-film coating over the organic light-emitting diodes. The conformal thin-film coating may be an aluminum oxide layer that is formed using atomic layer deposition techniques.

19 Claims, 10 Drawing Sheets

(58) Field of Classification Search
USPC ............... 257/40; 345/173; 313/504; 438/26
See application file for complete search history.

(56) References Cited

U.S. PATENT DOCUMENTS

| | | | | |
|---|---|---|---|---|
| 8,638,032 | B2 | 1/2014 | Maindron et al. | |
| 2003/0071569 | A1* | 4/2003 | Chung | H01L 51/5253 313/512 |
| 2004/0113550 | A1* | 6/2004 | Adachi | H01L 27/3246 313/512 |
| 2007/0295385 | A1* | 12/2007 | Sheats | H01L 31/0392 136/251 |
| 2010/0134426 | A1* | 6/2010 | Lee | G06F 3/0412 345/173 |
| 2010/0297798 | A1* | 11/2010 | Adriani | B32B 17/10678 438/64 |
| 2011/0036391 | A1* | 2/2011 | McCormick | G02F 1/13439 136/252 |
| 2011/0186871 | A1* | 8/2011 | Vaufrey | H01L 51/524 257/88 |
| 2011/0263091 | A1* | 10/2011 | Yamazaki | H01L 27/1225 438/287 |
| 2013/0244079 | A1* | 9/2013 | Mandlik | H01L 51/5253 429/122 |
| 2013/0334511 | A1* | 12/2013 | Savas | H01L 51/56 257/40 |
| 2015/0069333 | A1 | 3/2015 | Bedell, III et al. | |
| 2015/0145824 | A1 | 5/2015 | Park et al. | |
| 2015/0333293 | A1* | 11/2015 | Poon | H01L 51/5253 257/40 |
| 2016/0111684 | A1* | 4/2016 | Savas | H01L 51/5256 257/40 |
| 2016/0293880 | A1* | 10/2016 | Hakii | C22C 5/04 |

OTHER PUBLICATIONS

Chandra et al., “Silcon Nitride ARC Thin Films by New Plasma Enhanced Chemical Vapor Deposition Source Technology,” Photovoltaic Specialists Conference, 2008. [Retrieved on May 13, 2014]. Retrieved from the Internet<URL: http://ieeexplore.ieee.org/document/4922785/>.

* cited by examiner

ENCAPSULATION LAYERS WITH IMPROVED RELIABILITY

This application claims the benefit of provisional patent application No. 61/992,727, filed May 13, 2014, which is hereby incorporated by reference herein in its entirety.

BACKGROUND

This relates generally to electronic devices, and more particularly, to electronic devices with displays.

Electronic devices often include displays. For example, cellular telephones and portable computers often include displays for presenting information to a user.

Displays such as organic light-emitting diode displays often use an encapsulation layer to encapsulate the organic light-emitting diodes. However, conventional encapsulation layers may be unreliable. If care is not taken, moisture may allowed to penetrate the encapsulation layer which can in turn damage the organic light-emitting diodes.

It would therefore be desirable to be able to provide improved displays for electronic devices.

SUMMARY

An electronic device may be provided with a display. The display may be formed from an array of organic light-emitting diode display pixels. Each display pixel may have an organic light-emitting diode having an anode and a cathode. An associated pixel circuit in each display pixel may be used to control the light-emitting diode of that display pixel.

An encapsulation layer may be formed over the array of organic light-emitting diodes to protect the organic light-emitting diodes from moisture and other contaminants. The encapsulation layer may include a transparent sheet of material interposed between upper and lower inorganic films. The transparent sheet of material may be a layer of glass, polymer, or other suitable transparent dielectric material.

The reliability of the encapsulation layer is increased by dividing one or both of the inorganic films on the transparent sheet into multiple sub-layers. The sub-layers may have different densities and may be deposited in sequential steps. By depositing sub-layers of inorganic material in the encapsulation layer in sequential steps, an interface may be formed between the sub-layers. The presence of the interface may improve the moisture barrier properties of the encapsulation layer. For example, any pinholes, cracks, or other defects in a lower thin-film sub-layer may be covered by an upper thin-film sub-layer layer.

Additional moisture protection may be provided by forming a conformal thin-film coating over the organic light-emitting diodes. The conformal thin-film coating may be an aluminum oxide layer that is formed using atomic layer deposition techniques.

Further features, their nature and various advantages will be more apparent from the accompanying drawings and the following detailed description of the preferred embodiments.

DETAILED DESCRIPTION

Electronic devices may include displays. The displays may be used to display images to a user. Illustrative electronic devices that may be provided with displays are shown in FIGS. 1, 2, 3, and 4.

Figure 1:
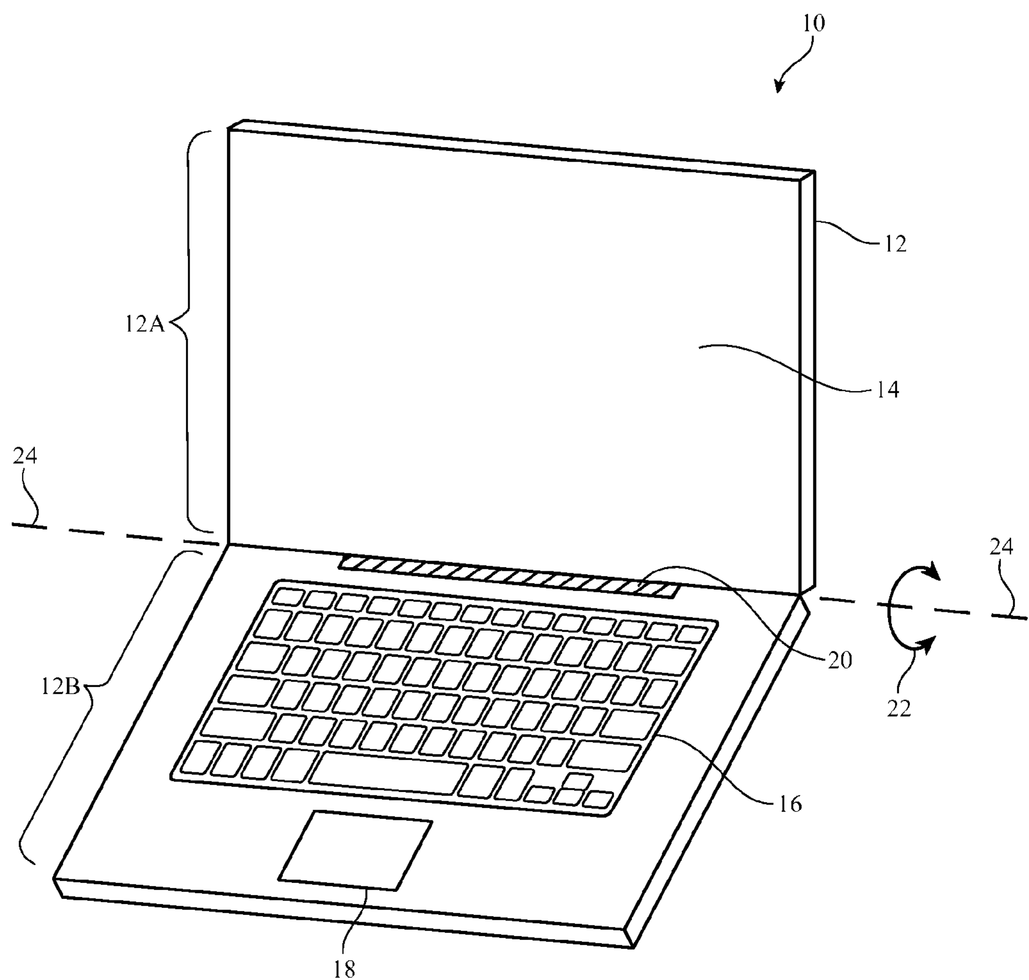
FIG. 1 is a perspective view of an illustrative electronic device such as a laptop computer with a display in accordance with an embodiment of the present invention.

FIG. 1 shows how electronic device 10 may have the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes referred to as a display housing or lid, may be placed in a closed position by rotating upper housing 12A towards lower housing 12B about rotational axis 24.

Figure 2:
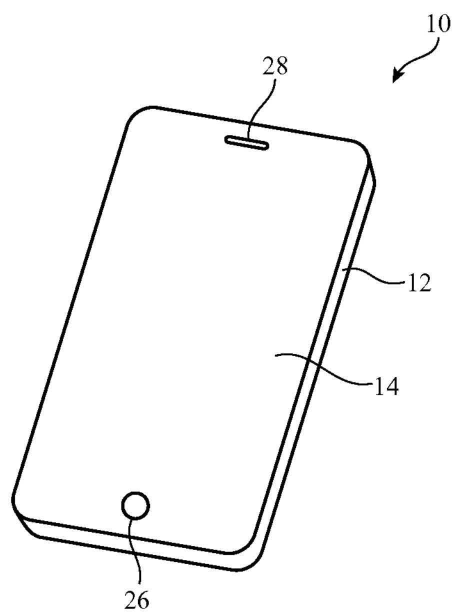
FIG. 2 is a perspective view of an illustrative electronic device such as a handheld electronic device with a display in accordance with an embodiment of the present invention.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
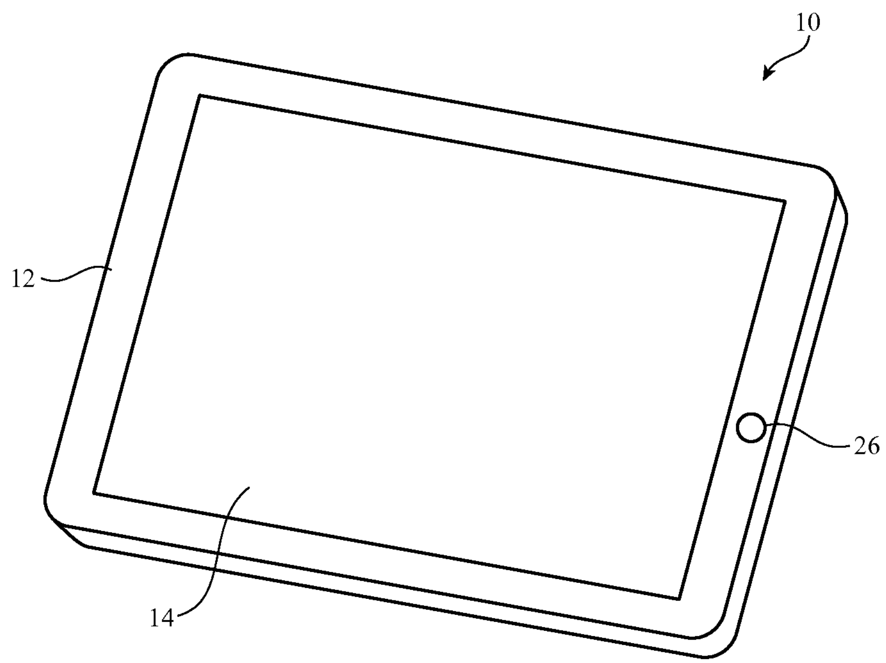
FIG. 3 is a perspective view of an illustrative electronic device such as a tablet computer with a display in accordance with an embodiment of the present invention.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
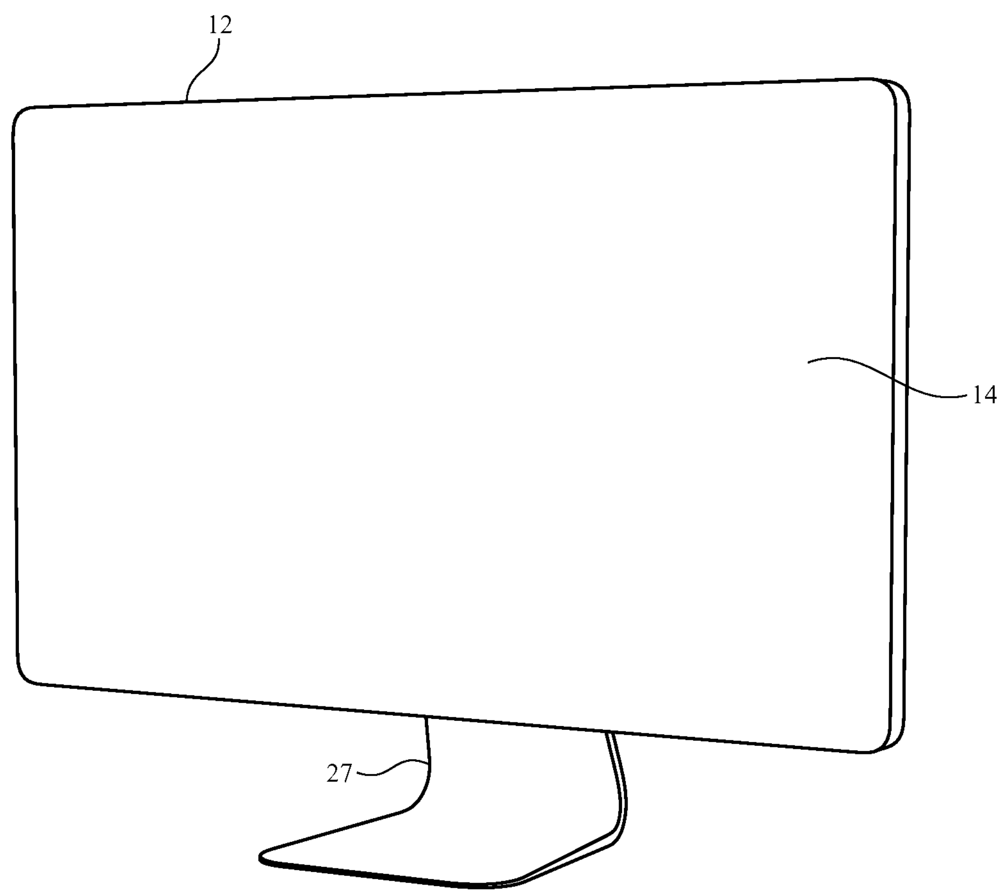
FIG. 4 is a perspective view of an illustrative electronic device such as a computer display with display structures in accordance with an embodiment of the present invention.

FIG. 4 shows how electronic device 10 may be a computer display or a computer that has been integrated into a computer display. With this type of arrangement, housing 12 for device 10 may be mounted on a support structure such as stand 27. Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from organic light-emitting diode components or other suitable display pixel structures.

A display cover layer may cover the surface of display 14 or a display layer such as a color filter layer, polarizer layer, polymer film, or other portion of a display may be used as the outermost (or nearly outermost) layer in display 14. The outermost display layer may be formed from a transparent glass sheet, a clear plastic layer, or other transparent member.

Figure 5:
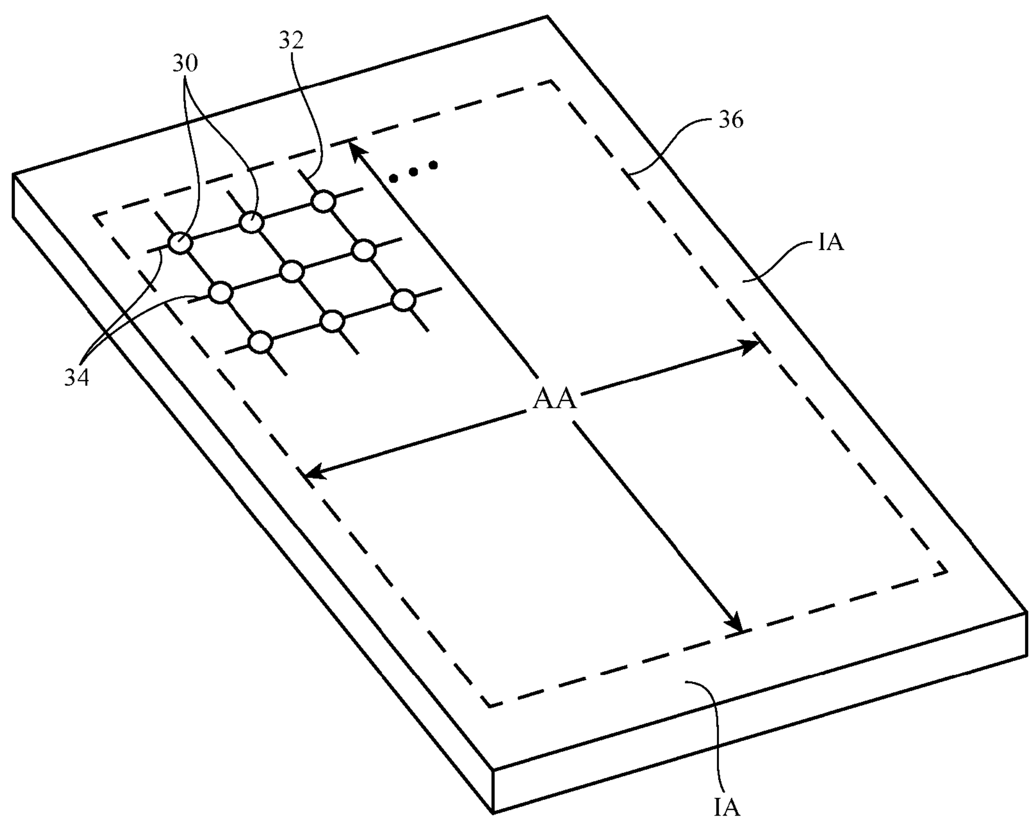
FIG. 5 is a perspective view of an illustrative display in accordance with an embodiment of the present invention.

A perspective view of an illustrative display is shown in FIG. 5. As shown in FIG. 5, display 14 may have an array of display pixels 30. Control signals may be supplied to display pixels 30 on vertical control lines 32 and horizontal control lines 34. By controlling display pixels 30, control circuitry in device 10 may display images for a user of device 10 on display 14.

Display pixels 30 may be arranged in a rectangular array in the center of display 14. During use of device 10, display pixels 30 form images, so display pixels 30 in display 14 are sometimes said to form an active area AA of display 14. Active area AA may be bounded by dashed line rectangle 36 in the example of FIG. 5. An inactive area IA may border some or all of the edges of active area AA. For example, a rectangular ring-shaped inactive area IA may form a border that surrounds active area AA, as shown in FIG. 5. Display 14 typically includes signal lines (e.g., metal traces) and other support circuitry for operating display 14 (i.e., circuitry for driving signals into display pixels 30) in inactive border region IA. The support circuitry in inactive area IA does not produce light for images on display 14.

To prevent structures in inactive area IA from being visible to a user of device 10, it may be desirable to cover areas IA with an opaque mask. The opaque mask may have the shape of a rectangular ring (i.e., the same shape as inactive area IA in FIG. 5) or may have other suitable shapes. Opaque masking material such as organic materials and/or inorganic materials may be used in forming an opaque masking layer in area IA. Examples of opaque masking material that may be used in forming an opaque masking layer include black chrome (chrome oxide), other metal oxides, black ink, ink of other colors (e.g., white ink, red ink, etc.), polymers, metals, oxides, nanotubes such as carbon nanotubes, black silicon (e.g., black silicon processed using a laser), nitrides, and other opaque materials. Materials such as opaque ink may be deposited using pad printing, screen printing, ink-jet printing, and other deposition techniques. Materials such as metal oxides and other inorganic materials may be deposited using vacuum coating (e.g., physical vapor deposition using an evaporator or sputtering tool). Shadow masking and/or photolithography may be used in patterning deposited masking material. If desired, opaque masking material may also be deposited using lamination techniques.

Figure 6:
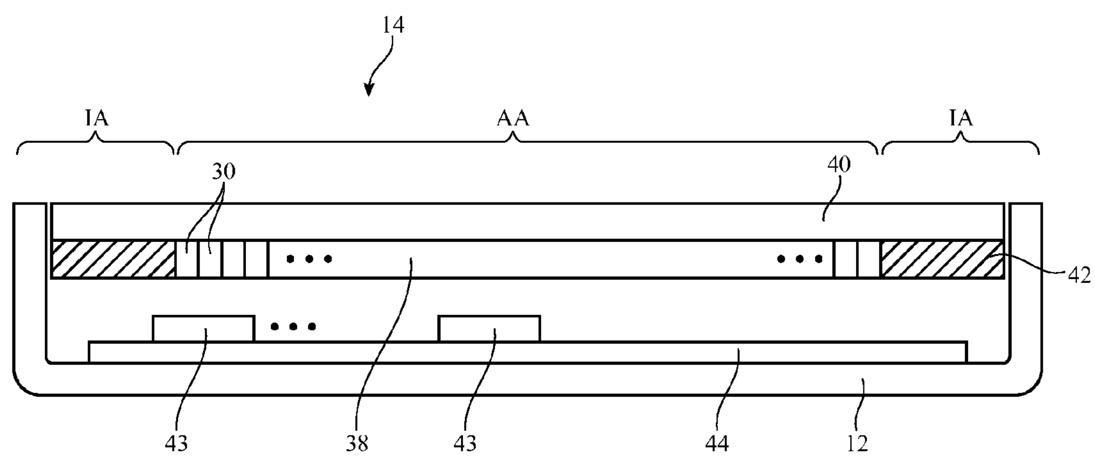
FIG. 6 is a cross-sectional side view of an electronic device with a display in accordance with an embodiment of the present invention.

FIG. 6 is a cross-sectional side view of an illustrative electronic device with a display. As shown in FIG. 6, device 10 may include housing 12. Display 14 may be mounted in housing 12. Display 14 may include an array of display pixels 30 in display structures 38. Display structures 38 may be based on organic light-emitting diode display structures including layers such as a substrate layer, an encapsulation layer, and an organic light-emitting diode layer containing organic light-emitting diode display pixels 30. In the example of FIG. 6, organic light-emitting diode display layers 38 are attached to the lower surface of an external display layer such as display cover layer 40. Display cover layer 40 may be formed from a layer of transparent glass, a clear plastic layer, or other transparent member (e.g., one or more clear sheets of material). Display cover layer 40 may help to protect underlying display structures such as organic light-emitting diode display structures 38. In inactive area IA, display structures 38 (e.g., the organic light-emitting diode layer of structures 38) may contain metal lines and other support circuitry 42. An opaque masking layer may be formed in inactive area IA to block the support circuitry from view. Display pixels 30 may form a rectangular array in active area AA.

Device 10 may have internal components 43 mounted on substrate 44. Components 43 may include integrated circuits such as microprocessors, application-specific integrated circuits, microcontrollers, and other processing circuitry. Components 43 may also include storage circuitry such as memory circuits and other memory devices. Input-output circuitry such as sensors, buttons, and other input-output circuitry may also be included in components 43. Substrates such as substrate 44 may be used to interconnect the circuitry of components 43. Substrate 44 may be a rigid printed circuit board (e.g., a fiberglass-filled epoxy board) or a flexible printed circuit (e.g., a printed circuit formed from a flexible substrate such as polyimide or other polymer layer).

Display 14 may be based on organic light-emitting diode display pixels or display pixels formed using other display technologies. Configurations for display 14 in which display pixels 30 are formed from organic light-emitting diodes and in which display 14 is an organic light-emitting diode display may sometimes be described herein as an example. This is, however, merely illustrative. Device 10 may, in general, include any suitable type of display.

Figure 7:
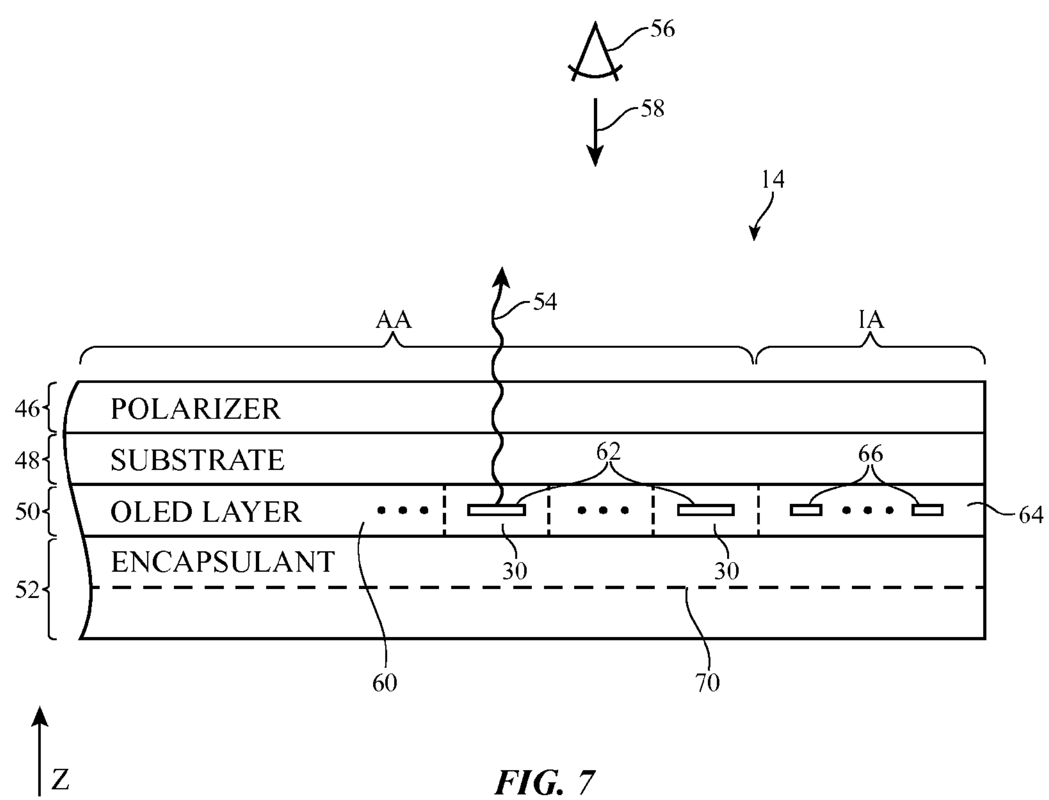
FIG. 7 is a cross-sectional side view of an illustrative bottom emission organic light-emitting diode display in accordance with an embodiment of the present invention.

A cross-sectional side view of display 14 in a configuration using a bottom emission organic light-emitting diode display configuration is shown in FIG. 7. As shown in FIG. 7, bottom emission organic light-emitting diode display 14 may have a substrate layer such as substrate 48. Substrate 48 may include one or more transparent layers such as one or more glass layers, one or more plastic layers, or other transparent substrate layers. As an example, substrate 48 may be formed from a layer of clear glass.

Organic light-emitting diode layer 50 may be formed on substrate 48 (i.e., on the surface of substrate 48 that is the lower or innermost of the two opposing surfaces of substrate 48 in the orientation of FIG. 7). During operation, light from display pixels 30 in organic light-emitting diode layer 50 may pass through substrate 48 (i.e., through substrate layer 48 on which the organic light-emitting diodes, thin-film-transistors, and other organic light-emitting diode circuitry have been formed) in direction Z, as illustrated by light ray 54.

In active area AA, organic light-emitting diode layer 50 includes organic light-emitting diode structures 60 (e.g., anode electrode structures, cathode electrode structures, emissive layers, signal lines, thin-film transistors, etc.). For example, active area organic light-emitting diode structures 60 in organic light-emitting diode layer 50 may include metal structures 62 (e.g., anode and cathode structures and metal traces for signal lines). The light produced by the organic light-emitting diode structures in active area AA of organic light-emitting diode layer 50 such as light ray 54 produces an image for a viewer such as viewer 56 who is viewing display 14 in direction 58.

In inactive area IA, organic light-emitting diode layer 50 includes inactive area organic light-emitting diode display structures such as inactive area structures 64. Inactive area structures 64 may include support circuitry such as metal traces for signal lines, thin-film circuitry such as driver circuitry, and other circuitry that does not produce light 54 for viewer 56. For example, inactive area structures 64 of organic light-emitting diode layer 50 may include metal structures such as metal traces for signal lines 66.

To suppress ambient light reflections from metal structures 62 (e.g., from reflective cathode structures in bottom emission display 14), display 14 may be provided with a reflection suppressing layer such as circular polarizer layer 46. Circular polarizer 46 may, if desired, overlap with inactive area IA, as shown in FIG. 7.

Encapsulant layer 52 may be formed on organic light-emitting diode layer 50 (i.e., on the lower surface of layer 50 in the orientation of FIG. 7). Encapsulant layer 52 may be used to encapsulate the organic light-emitting diode structures of organic light-emitting diode layer 50. Encapsulant layer 52 may be formed from a glass or plastic layer, may be formed from a glass or plastic layer coated with a thin film such as an inorganic coating, may be formed from a layer of metal (e.g., a metal plate, metal can, or metal foil), or may be formed from a metal coating on a substrate layer such as a glass layer or plastic layer (as examples). If desired, a coating of water-absorbing and/or oxygen absorbing material may be formed on a glass layer or other encapsulant layer to help sequester oxygen and water. As illustrated by dashed line 70, encapsulant layer 52 may contain two or more sublayers (e.g., a glass plate and a coating, a metal layer on a glass or polymer substrate or other dielectric layer, etc.).

Figure 8:
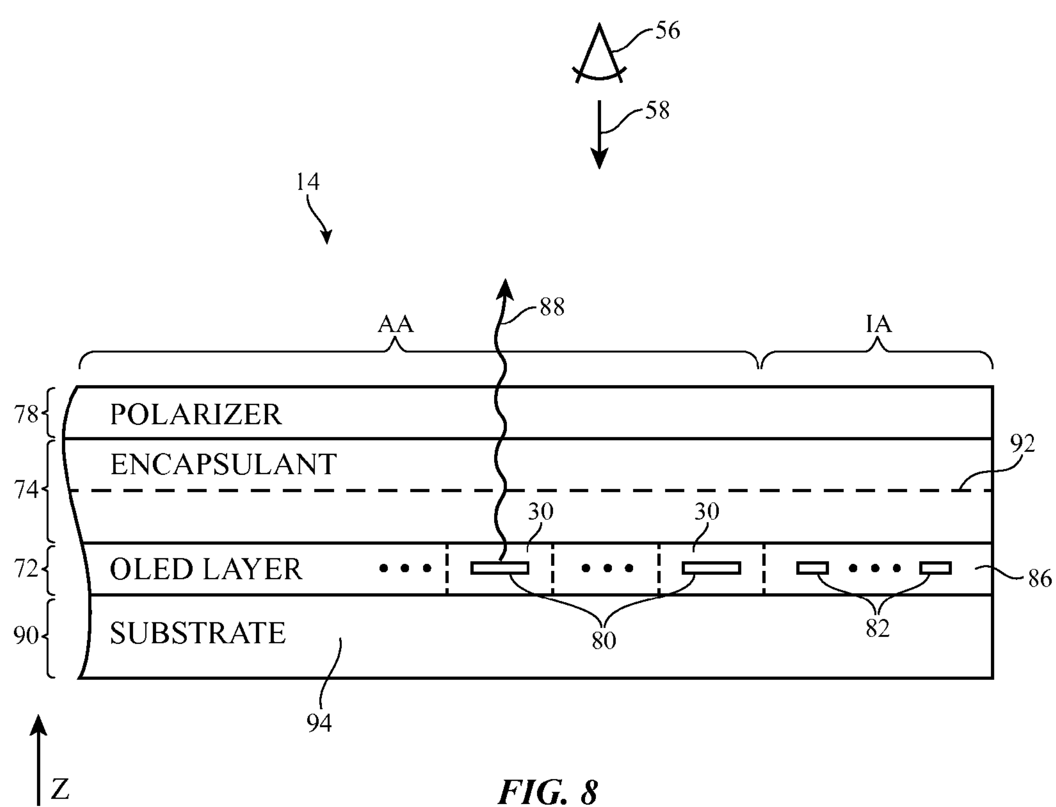
FIG. 8 is a cross-sectional side view of an illustrative top emission organic light-emitting diode display with a reflection suppression layer formed from a circular polarizer in accordance with an embodiment of the present invention.

A cross-sectional side view of display 14 in a configuration using a top emission organic light-emitting diode display configuration is shown in FIG. 8. As shown in FIG. 8, top emission organic light-emitting diode display 14 may have a substrate layer such as substrate 90. Substrate 90 may include one or more transparent layers such as one or more glass layers, one or more plastic layers, or other transparent substrate layers. As an example, substrate 90 may be formed from a layer of glass.

Organic light-emitting diode layer 72 may be formed on substrate 90 (i.e., on the upper surface of substrate 90 in the orientation of FIG. 8). During operation, light from display pixels 30 in organic light-emitting diode layer 72 may pass upwards in Z, as illustrated by light ray 88.

In active area AA, organic light-emitting diode layer 72 includes organic light-emitting diode structures 94 (e.g., anode electrode structures, cathode electrode structures, emissive layers, signal lines, thin-film transistors, etc.). For example, active area organic light-emitting diode structures 94 in organic light-emitting diode structures layer 72 may include reflective structures 80 (e.g., anode and cathode structures and metal traces for signal lines such as a reflective anode formed from a metal such as aluminum or a metal such as aluminum that has been covered with a coating such as indium tin oxide). The light produced by the organic light-emitting diode structures in active area AA of organic light-emitting diode layer 72 such as light ray 88 produces an image for a viewer such as viewer 56 who is viewing display 14 in direction 58.

In inactive area IA, organic light-emitting diode layer 72 includes inactive area organic light-emitting diode display structures such as inactive area structures 86. Inactive area structures 86 may include supporting circuitry such as metal traces for signal lines, and other circuitry that does not produce light 88 for viewer 56 but that supports the operation of the display pixels in active area AA. For example, inactive area structures 86 of organic light-emitting diode layer 72 may include metal structures such as metal traces for signal lines 82.

To suppress ambient light reflections from metal structures 80 (e.g., from reflective anode structures in top emission display 14), display 14 may be provided with a reflection suppressing layer (reflection suppression layer) such as circular polarizer layer 78. Circular polarizer 78 may, if desired, overlap inactive area IA and may cover support circuitry 86, as shown in FIG. 8.

Encapsulant layer 74 may be formed on layer 72 under polarizer 78 and may be used to encapsulate the organic light-emitting diode structures of organic light-emitting diode layer 72. Encapsulant layer 74 may be formed from a transparent material such as a clear glass layer, a clear layer of polymer, a clear inorganic thin-film, or other clear materials. As an example, layer 74 may be formed from a sheet of transparent glass. As illustrated by dashed line 92, encapsulant layer 74 may contain two or more sublayers. For example, encapsulant layer 74 may be formed from a glass plate that is covered with an inorganic thin-film coating.

Figure 9:
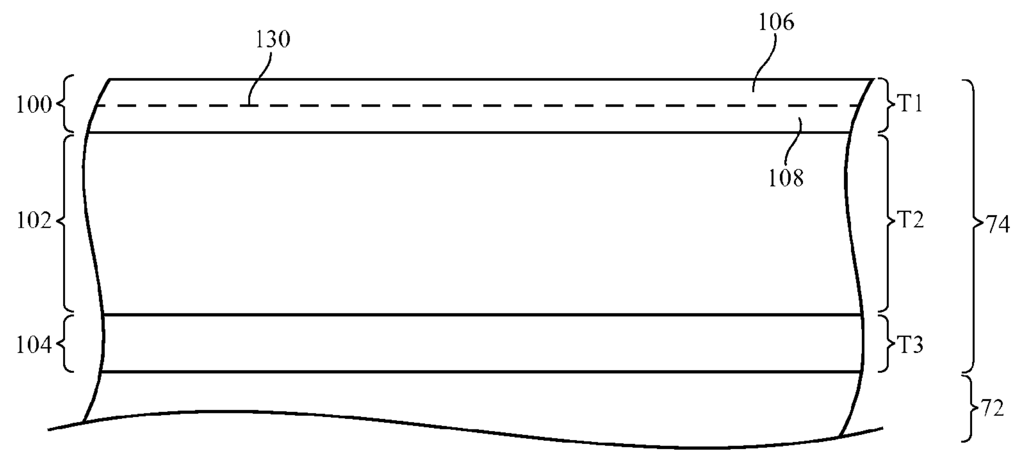
FIGS. 9-12 show cross-sectional side views of illustrative encapsulation layers that may be use to encapsulate organic light-emitting diodes in accordance with embodiments of the present invention.

FIG. 9 is a cross-sectional side view of an illustrative encapsulation layer such as encapsulation layer 74 that may be formed over an organic light-emitting diode layer such as organic light-emitting diode layer 72. As shown in FIG. 9, encapsulation layer 74 may include a polymer layer such as transparent polymer substrate layer 102 (e.g., a layer of epoxy, polyimide, polyethylene, polypropylene, or other polymeric film) interposed between first and second inorganic films such as inorganic thin-films 100 and 104. Inorganic films 100 and 104 may be formed from an inorganic material such as silicon nitride ($Si_3N_4$ or $SiN_x$), silicon dioxide, other inorganic materials, a combination of any two or more of these materials, etc.

Polymer substrate layer 102 may have a thickness T2 of about 20 microns, whereas thicknesses T1 and T3 of inorganic films 100 and 104 may each be equal to about 1 micron (as an example). This is, however, merely illustrative. If desired, layers 100, 102, and 104 may have other thicknesses. For example, layers 100 and 104 may each be between 0.5 and 1 microns, between 0.5 and 2 microns, less than 2 microns, more than 2 microns, etc. Layer 102 may be 15 microns, 15-20 microns, 18-22 microns, more than 20 microns, less than 20 microns, etc.

Inorganic thin-films 100 and 104 may be deposited using plasma-enhanced chemical vapor deposition (PECVD) techniques (e.g., low temperature PECVD processing techniques) or other suitable thin-film deposition techniques.

The reliability of encapsulation layer 74 may be enhanced by forming inorganic film layer 100 and/or inorganic film layer 104 as multi-layer films rather than single-layer films. Forming one or both of inorganic film layers 100 and 104 as multi-layer films may improve the moisture barrier properties of the inorganic films.

As shown in FIG. 9, inorganic film 100 may be formed with multiple thin-film sub-layers layers such as thin-film sub-layers 106 and 108. Thin-film sub-layers 106 and 108 may have equal thicknesses or non-equal thicknesses. As an example, thin-film sub-layers 106 and 108 may each have a thickness of about 0.5 microns. This is, however, merely illustrative. If desired, thin-film layers 106 and 108 may have different respective thicknesses.

Thin-film sub-layers 106 and 108 may be deposited in separate steps. For example, thin-film layer 108 may be deposited over polymer substrate layer 102 in a first step, and thin-film layer 106 may be deposited over thin-film layer 108 in a second step. By depositing layers 108 and 106 in separate steps, an interface such as interface 130 may be formed between sub-layers 106 and 108. The presence of interface 130 may improve the moisture barrier properties of inorganic film 100. For example, any pinholes, cracks, or other defects in thin-film layer 108 may be covered by thin-film layer 106. In this way, moisture or other contaminants may be prevented from penetrating from the upper surface of inorganic film 100 to the lower surface of inorganic film 100 through a single pinhole.

The example of FIG. 9 in which inorganic film 100 includes two sub-layers is merely illustrative. If desired, inorganic film 100 may include three sub-layers deposited in three separate steps, four sub-layers deposited in four separate steps, etc. In general, inorganic film 100 may include N sub-layers (e.g., sub-layers such as sub-layers 106 and 108) deposited in N separate steps. Arrangements in which inorganic film 100 includes two sub-layers 106 and 108 are sometimes described herein as an example.

The moisture barrier properties of inorganic film 100 may also be enhanced by adjusting the density of one or more of sub-layers 106 and 108. For example, the density of sub-layer 106 and/or sub-layer 108 may correspond to a refractive index of 1.8 to 1.85, 1.85 to 1.9, 1.9 to 1.95, 1.95 to 2.0, higher than 2.0, lower than 2.0, etc. Using higher density silicon nitride materials (e.g., silicon nitride materials with higher refractive indices) to form sub-layer 106 and/or sub-layer 108 may improve the moisture barrier properties of inorganic film 100.

In one suitable arrangement, both sub-layer 106 and sub-layer 108 may be formed from a relatively high density silicon nitride material (e.g., a silicon nitride material with a refractive index of 1.85-2.0). In another suitable arrangement, one sub-layer (e.g., sub-layer 108) may be formed with a relatively low density silicon nitride material (e.g., a silicon nitride material with a refractive index of 1.8-1.85) while the other sub-layer (e.g., sub-layer 106) may be formed with a relatively high density silicon nitride material (e.g., a silicon nitride material with a refractive index of 1.85-2.0). This is, however, merely illustrative. If desired, both sub-layers 106 and 108 may be formed with relatively low density silicon nitride material (e.g., a silicon nitride material with a refractive index of 1.8-1.85).

Figure 10:
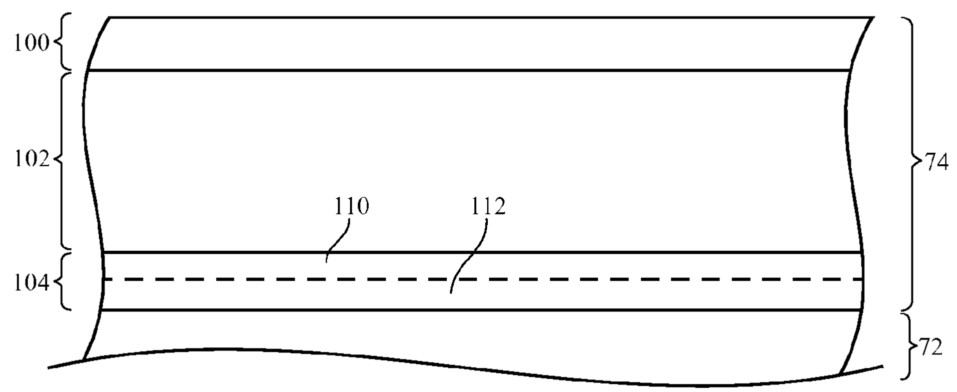

The example of FIG. 9 in which upper inorganic film 100 is a multi-layer inorganic film while lower inorganic film 104 is a single-layer inorganic film is merely illustrative. If desired, lower inorganic film 104 may be a multi-layer film. For example, as shown in FIG. 10, lower inorganic layer 104 may include multiple sub-layers such as thin-film sub-layers 110 and 112. As with the example of FIG. 9, thin-film sub-layers 110 and 112 may be deposited in separate steps such that any pinholes or defects in one sub-layer are covered by the other sub-layer. Thin-film sub-layers 110 and 112 may have equal densities or may have different densities (as described in connection with layers 106 and 108).

Figure 11:
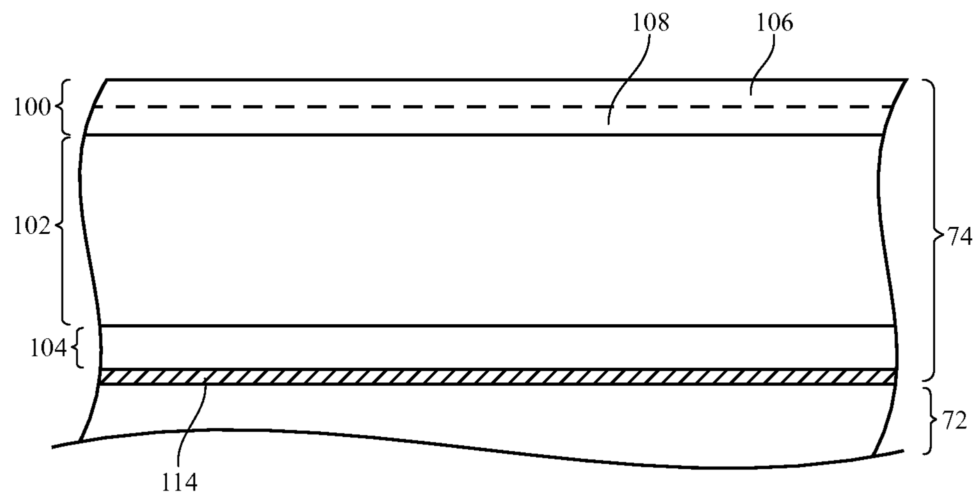

If desired, additional moisture barrier layers may be incorporated into encapsulation layer 74. For example, as shown in FIG. 11, a moisture barrier layer such as moisture barrier layer 114 may be incorporated into encapsulation layer 74. Moisture barrier layer 114 may be a thin-film (e.g., a thin-film of aluminum oxide or other material) deposited using atomic layer deposition (ALD) techniques (as an example). Using atomic layer deposition techniques to deposit moisture barrier layer 114 over organic light-emitting diode layer 72 may result in a thin conformal coating that fills any voids, crevices, or air gaps present on the surface of organic light-emitting diode layer 72. This type of conformal thin-film coating may effectively moisture-seal organic light-emitting diode layer 72 to prevent moisture and other contaminants from penetrating organic light-emitting diode layer 72.

Figure 12:
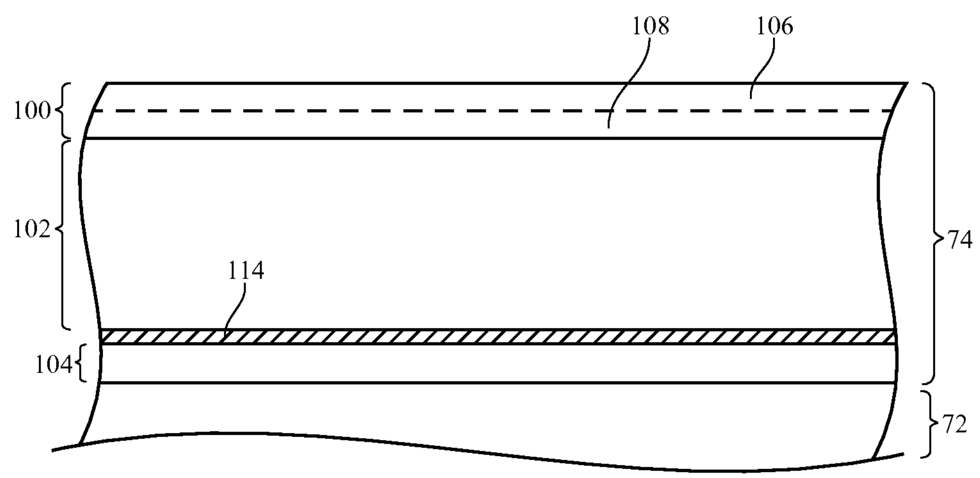

The example of FIG. 11 in which conformal coating 114 (sometimes referred to as ALD film 114) is deposited on the surface of organic light-emitting diode layer 72 is merely illustrative. If desired, conformal coating 114 may be deposited over lower inorganic film 104. For example, as shown in FIG. 12, conformal coating 114 may be interposed between inorganic film 104 and polymer substrate layer 102. If desired, more than one conformal coating 114 may be incorporated into or formed on encapsulation layer 74.

Figure 13:
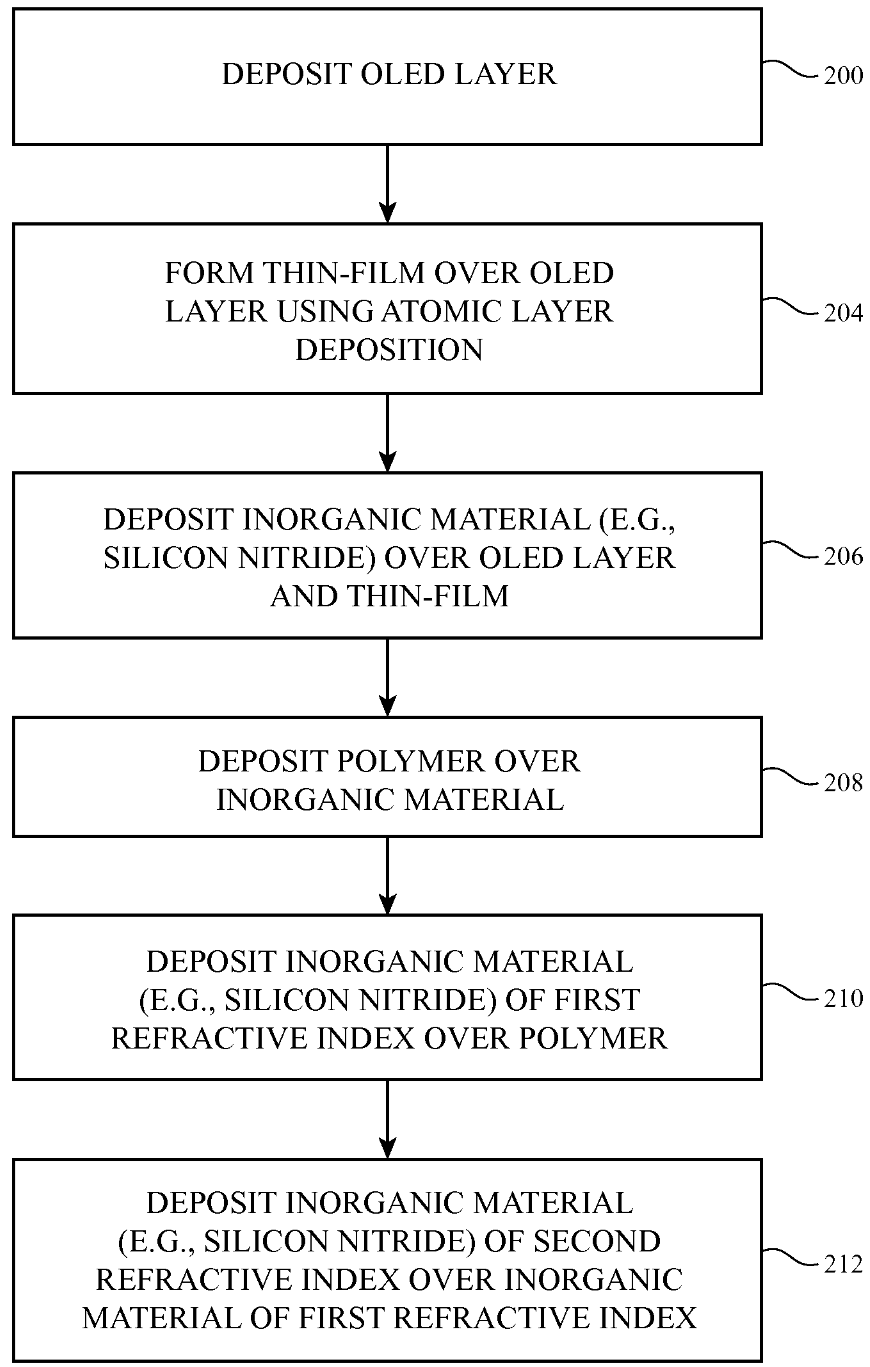
FIG. 13 is a flow chart of illustrative steps involved in forming an encapsulation layer for encapsulating organic light-emitting diodes in accordance with an embodiment of the present invention.

FIG. 13 is a flow chart of illustrative steps involved in forming an encapsulation layer (e.g., an encapsulation layer of the type shown in FIG. 11).

At step 200, an organic light-emitting diode layer such as layer 72 of FIG. 8 may be deposited on a substrate such as substrate 90.

At step 204, a conformal thin-film such as a thin-film of aluminum oxide may be formed on the organic light-emitting diode layer using atomic layer deposition equipment. This may include, for example, depositing first and second chemicals (precursors) in sequential steps onto the surface of the organic light-emitting diode layer (e.g., in a vacuum). The thin-film resulting from the atomic layer deposition process may form a conformal coating over the organic light-emitting diode layer that fills any voids, crevices, or air gaps present on the surface of the organic light-emitting diode layer.

At step 206, plasma-enhanced chemical vapor deposition equipment may be used to deposit a thin-film of inorganic material such as silicon nitride over the conformal thin-film and the organic light-emitting diode layer.

At step 208, a polymer substrate layer may be formed over the inorganic material (e.g., using screen printing tools or other suitable equipment).

At step 210, plasma-enhanced chemical vapor deposition equipment may be used to deposit a first thin-film sub-layer of inorganic material such as silicon nitride over the polymer substrate layer. The first thin-film sub-layer of inorganic material may, if desired, have a refractive index of 1.8 (as an example).

At step 212, plasma-enhanced chemical vapor deposition equipment may be used to deposit a second thin-film sub-layer of inorganic material such as silicon nitride over the first thin-film sub-layer. The second thin-film sub-layer of inorganic material may, if desired, have a refractive index of 1.85 (as an example).

The foregoing is merely illustrative of the principles of this invention and various modifications can be made by those skilled in the art without departing from the scope and spirit of the invention.

What is claimed is:

1. An encapsulation layer for encapsulating organic light-emitting diodes, comprising:

a first inorganic layer having multiple sub-layers;

a second inorganic layer; and a transparent dielectric layer interposed between the first and second inorganic layers, wherein the transparent dielectric layer comprises a layer of polymer.

2. The encapsulation layer defined in claim 1 wherein the first and second inorganic layers comprise silicon nitride.

3. The encapsulation layer defined in claim 2 wherein the sub-layers have different respective densities.

4. The encapsulation layer defined in claim 2 wherein the sub-layers have different respective indices of refraction.

5. The encapsulation layer defined in claim 1 further comprising a conformal thin-film coating formed on a surface of the organic light-emitting diodes.

6. The encapsulation layer defined in claim 5 wherein the conformal thin-film coating comprises aluminum oxide.

7. The encapsulation layer defined in claim 1 further comprising a conformal thin-film coating interposed between the second inorganic layer and the transparent dielectric layer.

8. The encapsulation layer defined in claim 7 wherein the conformal thin-film coating comprises aluminum oxide.

9. An encapsulation layer for encapsulating organic light-emitting diodes, comprising:

a first inorganic layer having multiple sub-layers;

a second inorganic layer; and a transparent dielectric layer interposed between the first and second inorganic layers, wherein the transparent dielectric layer comprises a layer of glass.

10. A method for forming an encapsulation layer for encapsulating organic light-emitting diodes, comprising:

with deposition equipment, depositing a first inorganic layer over the organic light-emitting diodes;

depositing a transparent dielectric layer over the first inorganic layer; and with the deposition equipment, depositing a second inorganic layer over the transparent dielectric layer, where depositing the second inorganic layer comprises depositing a first sub-layer of inorganic material over the transparent dielectric layer and depositing a second sub-layer of inorganic material over the first sub-layer of inorganic material.

11. The method defined in claim 10 further comprising:

with atomic layer deposition equipment, forming a conformal film over the organic light-emitting diodes.

12. The method defined in claim 10 wherein the deposition equipment comprises plasma-enhanced chemical vapor deposition equipment.

13. The method defined in claim 10 wherein a refractive index of the first sub-layer of inorganic material is different than a refractive index of the second sub-layer of inorganic material.

14. The method defined in claim 10 wherein the first and second sub-layers of inorganic material comprise silicon nitride and wherein depositing the second sub-layer of inorganic material comprises depositing the second sub-layer of inorganic material after depositing the first sub-layer of inorganic material.

15. A display, comprising:

a substrate;

an array of organic light-emitting diodes formed on the substrate; and an encapsulation layer formed over the organic light-emitting diodes, wherein the encapsulation layer comprises a transparent sheet of material interposed between first and second inorganic films, wherein at least the first inorganic film comprises first and second sub-layers.

16. The display defined in claim 15 wherein the first and second sub-layers have different indices of refraction.

17. The display defined in claim 15 wherein the transparent sheet of material comprises a transparent polymer sheet and wherein the first and second inorganic films comprise silicon nitride.

18. The display defined in claim 15 further comprising a conformal thin-film interposed between the transparent sheet of material and the organic light-emitting diodes.

19. The display defined in claim 18 wherein the conformal thin-film comprises aluminum oxide.

* * * * *